United States Patent

[11] 3,603,979

[72] Inventor Henry Kosakowski Lyndhurst, N.J.
[21] Appl. No. 855,262
[22] Filed Sept. 4, 1969
[45] Patented Sept. 7, 1971
[73] Assignee The Bendix Corporation

[54] DIGITAL SYSTEM INCLUDING TEMPERATURE COMPENSATING MEANS
6 Claims, 4 Drawing Figs.

[52] U.S. Cl. .......... 340/347 AD, 235/92 CT, 324/105, 328/3, 340/347 CC
[51] Int. Cl. .......... H03k 13/17, G01d 3/04
[50] Field of Search .......... 340/347; 235/92; 328/3, 41, 45, 46; 324/105; 330/143

[56] References Cited

UNITED STATES PATENTS

| | | | |
|---|---|---|---|
| 2,500,581 | 3/1950 | Seeley | 235/92 X |
| 2,945,123 | 7/1960 | Parsons et al. | 330/143 |
| 3,201,781 | 8/1965 | Holland | 340/347 |
| 3,419,800 | 12/1968 | Levi et al. | 340/347 X |
| 3,419,819 | 12/1968 | Murakami et al. | 340/347 X |
| 3,443,070 | 5/1969 | Derby et al. | 235/92 |
| 3,463,999 | 8/1969 | Ames | 324/105 X |
| 3,521,269 | 7/1970 | Brooks et al. | 340/347 |

*Primary Examiner*—Maynard R. Wilbur
*Assistant Examiner*—Michael K. Wolensky
*Attorneys*—Ronald G. Gillespie and Plante, Hartz, Smith & Thompson

ABSTRACT: A two-speed system having a counter for providing a digital output corresponding to a condition in which a resolver provides an analog error signal corresponding to the difference between the condition and the digital output. The analog error signal is converted to pulses which are counted by the counter. Followup means connected to the counter and to the resolver nulls the error signal when the count in the counter corresponds to the condition. The null is defined by a pair of reference voltages and the count is stopped when the amplitude of the error signal is greater than one reference voltage and less than the other reference voltage. The counting rate of the counter is controlled by providing a high frequency pulse train to the counter when the error signal is above a predetermined amplitude and a low frequency pulse train when the error signal is below the predetermined amplitude. Independent high and low temperature compensation provides accurate operation over wide temperature range and eliminates trial and error adjustment.

INVENTOR.
HENRY R. KOSAKOWSKI
BY
Ronald G. Gillespie
ATTORNEY

INVENTOR.
HENRY R. KOSAKOWSKI
BY Ronald G. Gillespie
ATTORNEY

DIGITAL SYSTEM INCLUDING TEMPERATURE COMPENSATING MEANS

BACKGROUND OF THE INVENTION

1. Field of the Invention

This invention relates to indicating systems and, more particularly, to a digital indicating system.

2. Description of the Prior Art

Heretofore, a system providing a digital output corresponding to a condition such as described in U.S. Pat. application Ser. No. 615,791 now U.S. Pat. No. 3,562,740 by Benjamin M. Watkins and assigned to The Bendix Corporation, assignee of the present invention, uses a single counting rate when converting an analog error signal, corresponding to the difference between the condition and the digital output, to the digital output. Other systems use high and low temperature compensating means, that are dependent on each other, which require a trial and error method of adjustment.

The present invention improves on the speed of the Watkins system by providing a high speed counting rate until the error signal is near a null. A low speed counting rate is then provided until the error signal is at null.

The present invention further distinguishes over the Watkins invention by providing high temperature and low temperature compensating means which operate independently of each other, to provide accurate operation over a wide temperature range. The independent compensating means require only one adjustment at each temperature extreme and eliminates the trial and error method of adjustment as used heretofore.

SUMMARY OF THE INVENTION

A two-speed system for providing a digital output corresponding to a condition, comprising signal means providing an error signal corresponding to the difference between the digital output and the condition. Counting means provide the digital output. Counting rate control means, connected to the signal means and to the counting means, provide a pulse train of one frequency when the error signal is above a predetermined amplitude and a pulse train of a second frequency when the error signal is below the predetermined amplitude. Means, connected to the output of the counting means and connected to the signal means, nulls the error signal so that the count from the counting means corresponds to the condition when the error signal is at null.

One object of the invention is to provide a followup having no moving parts for nulling the output of a resolver.

Another object is to provide a high speed system for providing an output corresponding to a condition and having a signal device providing an error signal corresponding to the difference between the output and the condition, a counter, and a control circuit which slows the counting rate of the counter as the error signal from the signal device approaches a null so that initially the counter may count at a high speed.

Another object of the present invention is to increase the stability of an indicating system by stopping the counting when the error signal is at a predefined null.

Another object of the present invention is to increase the accuracy of the indicating system by providing temperature compensation on a wider temperature range.

Another object of the present invention is to provide independent high and low temperature compensation so that only two initial adjustments are required.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

Figure 1:
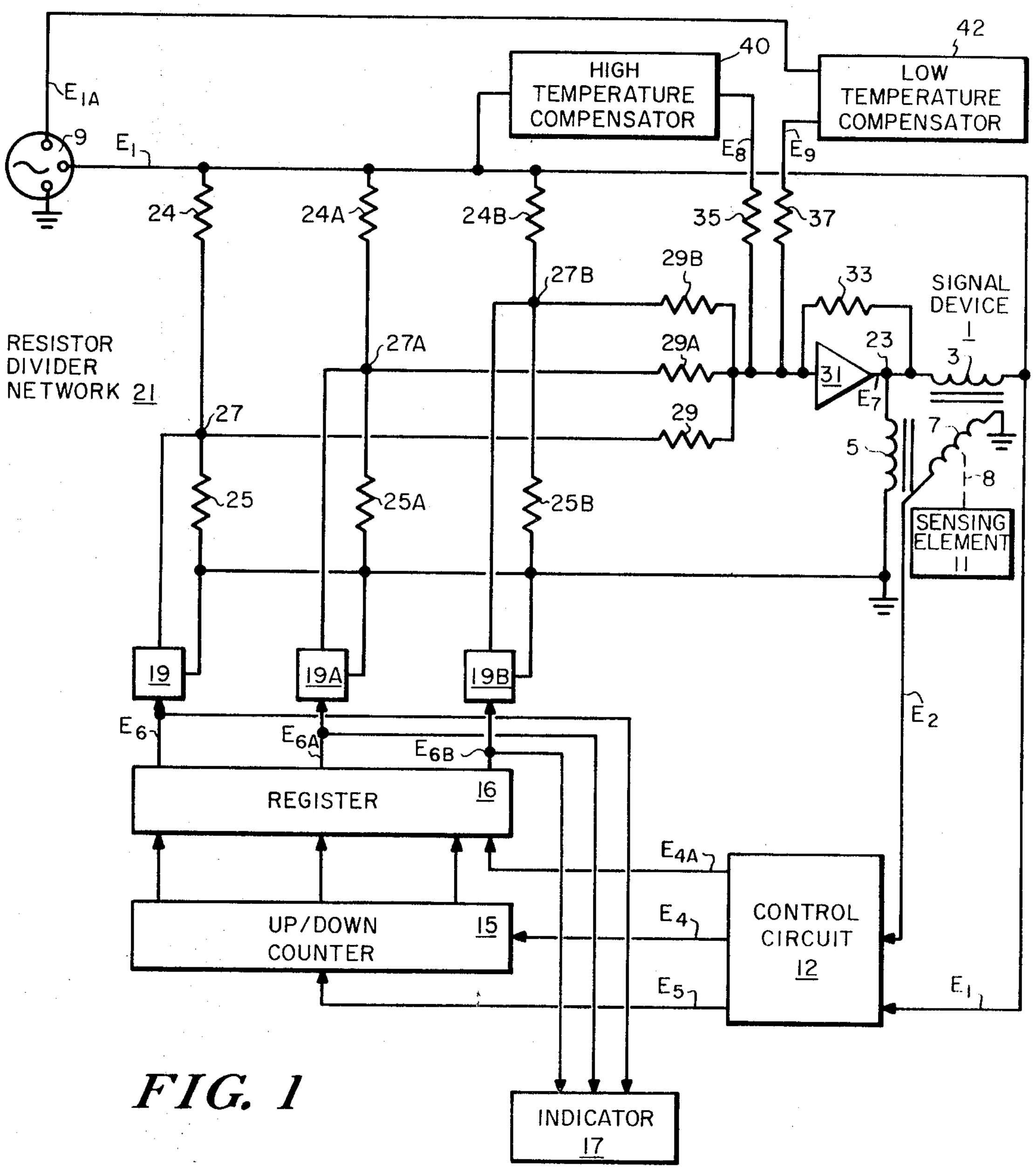
FIG. 1 is a block diagram of a novel digital indicating system, constructed in accordance with the present invention, for indicating a condition.

Referring to FIG. 1, there is shown a novel digital indicating system constructed according to the invention and comprising a signal device 1, such as a conventional sin-cos resolver, with stator windings 3 and 5 having a common node 23, and a rotor winding 7 mounted on a shaft 8 and having one end connected to ground. Stator winding 5 of signal device 1 is also connected to ground. An alternating current voltage source 9 connected to stator windings 3 and 5 energizes stator windings 3 and 5 by an alternating current voltage $E_1$ as hereinafter explained.

Rotor winding 7 and shaft 8 of signal device 1 are positioned by a sensing element 11, for example, a diaphragm for sensing pressure, and an error signal $E_2$ is developed across rotor winding 7 corresponding to the angular displacement of rotor winding 7 relative to the magnetic field of stator windings 3 and 5 as described hereinafter.

Figure 2:
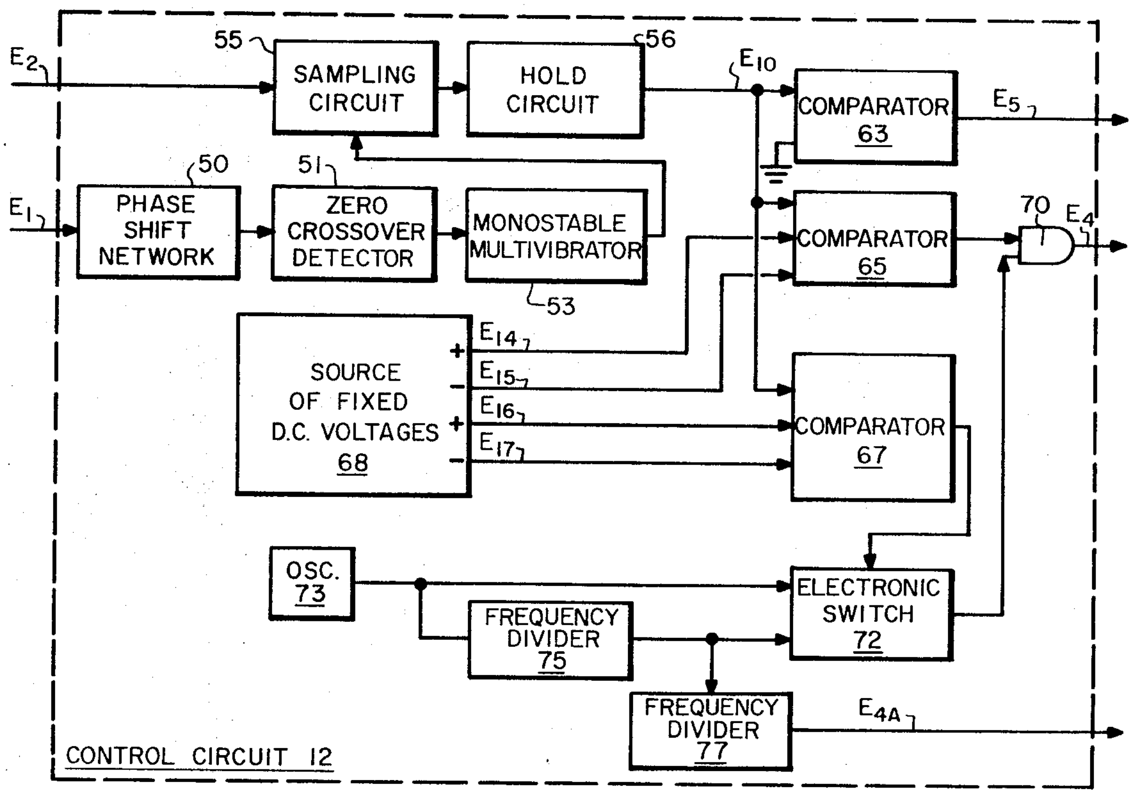
FIG. 2 is a block diagram of the control circuit shown in FIG. 1.

A control circuit 12, which may be of the type shown in detail in FIG. 2, controls a conventional type up/down counter 15 in accordance with error signal $E_2$ from signal device 1 and the voltage $E_1$ from source 9. Control circuit 12 provides a counting pulse train $E_4$ corresponding to error signal $E_2$ and a signal $E_5$ which controls the counting direction of counter 15. Counter 15 counts the pulses in the counting pulse train $E_4$ in a direction in accordance with signal $E_5$ and provides corresponding outputs.

A conventional type register 16 stores the outputs from counter 15 in response to a pulse in a pulse train $E_{4A}$ from circuit 12 and provides digital signals $E_6$, $E_{6A}$ and $E_{6B}$, corresponding to the stored count to switches 19, 19A and 19B and to an indicator 17. Signals $E_6$, $E_{6A}$, and $E_{6B}$ also correspond to the condition and to the angular displacement of the rotor winding 7 of signal device 1 from a predetermined position when the error signal is at a null.

The magnetic field of signal device 1 rotates in accordance with a control voltage $E_7$ from resistor divider network 21 which is applied to node 23 of signal device 1 through an amplifier 31. Network 21 includes pairs of series connected resistors 24 and 25, 24A and 25A, and 24B and 25B connected in parallel across source 9 and having common nodes 27, 27A and 27B, respectively. Switches 19, 19A and 19B are connected, respectively, to nodes 27, 27A and 27B and to ground and control the voltages at nodes 27, 27A and 27B, and hence voltage $E_7$, in response to the outputs from register 16. Resistors 29, 29A and 29B connect nodes 27, 27A and 27B, respectively, to an amplifier 31. The output of amplifier 31 is connected to its input through a feedback resistor 33 and to node 23 of stator windings 3 and 5 of signal device 1.

Figure 3:
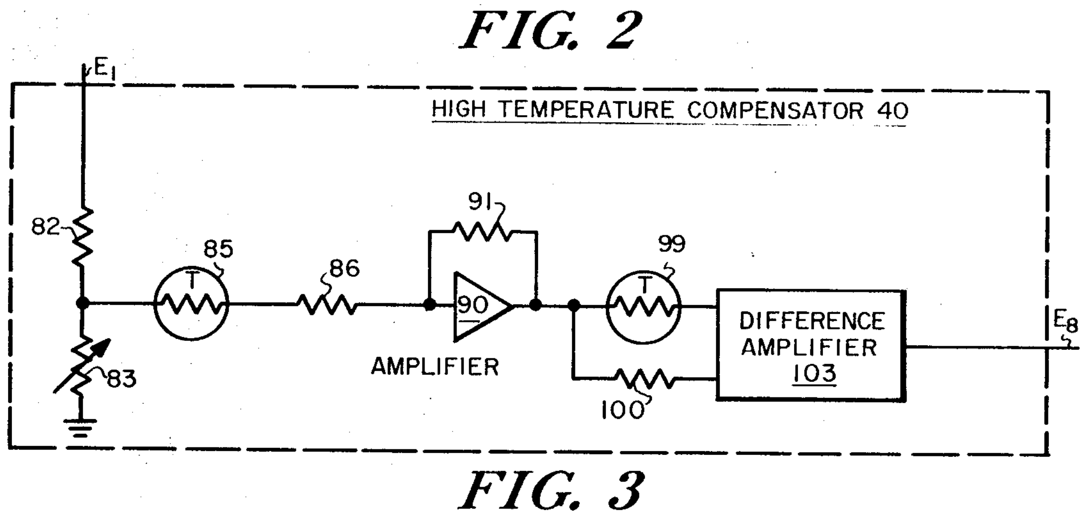
FIGS. 3 and 4 are schematic diagrams of the high and low temperature compensators, respectively, shown in FIG. 1.
Figure 4:
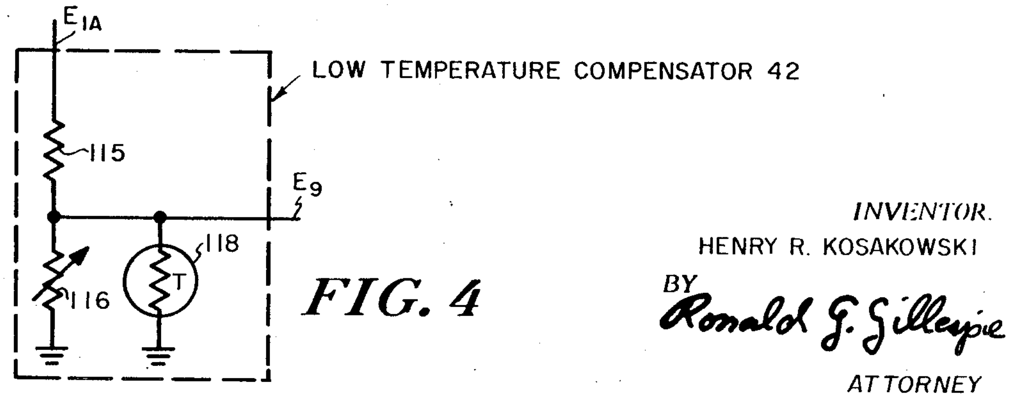

High and low temperature compensators 40 and 42, which may be of the type shown in detail in FIGS. 3 and 4, respectively, provide compensating signals $E_8$ and $E_9$, respectively. Signals $E_8$ and $E_9$, are applied to summing resistors 35 and 37 respectively, which in turn sum signals $E_8$ and $E_9$ with the voltage from resistor divider network 21. Signal $E_8$ increases as the temperature increases to effectively increase the voltage from network 21 to amplifier 31 to maintain voltage $E_7$ at a suitable amplitude. Signal $E_9$ is out of phase with the voltage from network 21 and increases as the temperature decreases to effectively reduce the voltage from network 21 to amplifier 31 to maintain voltage $E_7$ at a suitable amplitude. Compensators 40 and 42 may be adjusted independently so that only one adjustment at each temperature extreme is required.

Referring to FIG. 2, error signal $E_2$ is converted to a direct current signal $E_{10}$ by a phase shift network 50, a zero crossover detector 51, a monostable multivibrator 53, a sampling circuit 55, and a hold circuit 56 connected in series. Network 50 receives voltage $E_1$ from source 9 and provides an output having a 90° phase difference with voltage $E_1$. Detector 51 detects the zero crossover points of the output from network 50 and provides corresponding pulses to monostable multivibrator 53. Multivibrator 50 applies sampling pulses to sampling circuit 55 in response to alternate pulses from detector 51. Circuit 55 samples error signal $E_2$ from signal device 1 in response to the sampling pulses from multivibrator 53 so as to effect quadrature rejection.

A hold circuit 56 holds the samples from circuit 55 to provide direct current signal $E_{10}$ to comparators 63, 65 and 67. Comparator 63 compares signal $E_{10}$ with a ground reference and provides a signal $E_5$ corresponding to the comparison for controlling the counting direction of counter 15. Comparator 65 starts and stops the count by counter 15 and comparator 67 controls the counting rate of counter 15.

A source 68 of fixed direct current voltages provides positive reference voltages $E_{14}$ and $E_{16}$, and negative reference voltages $E_{15}$ and $E_{17}$ which are equal in amplitude to reference voltages $E_{14}$ and $E_{16}$, respectively. Voltages $E_{14}$ and $E_{15}$ define limits for a null for error signal $E_2$. Voltages $E_{16}$ and $E_{17}$ define near null limits for error signal $E_2$. Comparator 65 compares signal $E_{10}$ to reference voltage $E_{14}$ and $E_{15}$ and provides an output when signal $E_{10}$ is less positive than reference voltage $E_{14}$ and more positive than reference voltage $E_{15}$. Comparator 67 compares signal $E_{10}$ with reference voltages $E_{16}$ and $E_{17}$ and provides an output when signal $E_{10}$ is less positive than voltage $E_{16}$ and more positive than voltage $E_{17}$.

An oscillator 73 and a frequency divider 75, connected to oscillator 73, provide high and low frequency pulse trains, respectively, to an electronic switch 72 which is controlled by comparator 67. Electronic switch 72 applies the high frequency counting pulse train from oscillator 73 to an AND gate 70 during the absence of an output from comparator 67. Switch 72 applies the low frequency counting pulse train from frequency divider 75 to AND gate 70 in response to an output from comparator 67. Although an oscillator and a frequency divider are shown, other means may be used for providing counting pulse trains having two different frequencies.

AND gate 70 starts and stops the counting by counter 15 by providing counting pulse train $E_4$ to counter 15 in response to an output from comparator 65 and blocking the counting pulse train $E_4$ during the absence of an output from comparator 65. A frequency divider 77 is connected to frequency divider 75 and to register 16 and provides pulse train $E_{4A}$ for the purpose described above.

Referring to FIG. 1 and 3 there is shown high temperature compensator 40 receiving alternating current voltage $E_1$ from source 9 which is applied to a voltage divider network including resistors 82 and 83 serially connected to ground. Resistor 83 is a variable resistor which is adjusted to change compensating signal $E_8$ while at a high temperature level to calibrate compensator 40. A thermistor 85 connected between resistors 82 and 83 allows compensator 40 to compensate for an increase in ambient temperature above a reference temperature level and prevents compensator 40 from compensating for a decrease in ambient temperature below the reference temperature level.

A resistor 86 improves the linearity of compensator 40 and connects thermistor 85 to an amplifier 90 which provides a corresponding output. A feedback resistor 91 connected between an input and an output of amplifier 90 cooperates with thermistor 85 and resistor 86 to control the gain of amplifier 90. A network, including a thermistor 99 and a resistor 100, is connected to the output of amplifier 90 and provides two outputs which are equal at the reference temperature level, to a conventional type difference amplifier 103.

An increase in temperature unbalances the network causing a difference in the two outputs applied to amplifier 103. Amplifier 103 provides compensating signal $E_8$ corresponding to the difference between the outputs from thermistor 99 and resistor 100.

Referring to FIGS. 1 and 4, there is shown source 9 also providing a voltage $E_{14}$, which is 180° out of phase with voltage $E_1$, to low temperature compensator 42. Voltage $E_{14}$ is applied to a voltage divider network including resistors 115 and 116 serially connected to ground. Resistor 116 is a variable resistor, and is adjusted to change compensating signal $E_9$ while at a low temperature level to calibrate compensator 42. A thermistor 118 shunts resistor 116 and cooperates with resistor 116 to cause compensating signal $E_9$ to increase as a function of a decrease in temperature.

OPERATION

Referring to FIG. 1, rotor winding 7 of signal device 1 is mechanically positioned relative to the magnetic field of stator windings 3 and 5 by an analog signal from sensing element 11. Error signal $E_2$ corresponding to the angular displacement of rotor winding 7 relative to the stator magnetic field appears across rotor winding 7. Error signal $E_2$ is applied to control circuit 12 which provides counting pulse train $E_4$ and counting direction signal $E_5$, as hereinafter explained, to counter 15. The count in counter 15, is transferred to register 16 which operates switches 19, 19A and 19B and controls the transfer function of resistor network 21 to control voltage $E_7$ from amplifier 31 appearing at node 23 of stator windings 3 and 5 of signal device 1. Voltage $E_7$ rotates the magnetic field provided by the stator winding 3 and 5 of signal device 1. When the magnetic field is perpendicular to the angular displacement of the rotor winding 7 error signal $E_2$ across rotor winding 7 is at null and the count in counter 15 corresponds to the angular position of rotor winding 7 of signal device 1 and to the condition.

Register 16 provides outputs $E_6$, $E_{6A}$ and $E_{6B}$ to indicator 17 for indicating a digital representation of the condition corresponding to the angular position of rotor winding 7 of signal device 1.

Referring to FIG. 2, error signal $E_2$ decreases in amplitude as a null is approached causing a corresponding decrease in direct current signal $E_{10}$ from hold circuit 56. Comparator 67 compares signal $E_{10}$ to reference voltages $E_{16}$ and $E_{17}$ which represents limits of approach to null.

When signal $E_{10}$ is more positive than voltage $E_{16}$ or more negative than voltage $E_{17}$, comparator 67 provides no output to switch 72. Switch 72 applies the high frequency pulse train from oscillator 73 to counter 15 causing the counter to count at a fast rate. When signal $E_{10}$ is less positive than reference voltage $E_{16}$ and more positive than reference voltage $E_{17}$, comparator 67 provides an output to electronic switch 72. Switch 72 then applies the low frequency counting pulse train from frequency divider 75 in response to the output from comparator 67 causing the counter 15 to count at a slow rate as error signal $E_2$ approaches the null. When the null is achieved, as defined by reference voltage $E_{14}$ and $E_{15}$, comparator 65 provides an output which disables AND gate 70. AND gate 70 blocks the counting pulse train $E_4$ from electronic switch 72 causing counter 15 to stop counting. The count in counter 15 when error signal $E_2$ is at the null corresponds to the condition.

Referring to FIG. 3, as the ambient temperature decreases below the reference temperature level, the resistance of thermistor 85 increases thereby reducing the gain of amplifier 90 to less than unity when the ambient temperature is less than the reference temperature level so that signal $E_8$ remains at a near zero amplitude level. When the ambient temperature increases above the reference temperature level, the resistance of thermistor 85 decreases and thereby increasing the gain of amplifier 90 and causing the output from amplifier 90 to increase.

The increased temperature reduces the resistance of thermistor 99 unbalancing the previously balanced network and creating a voltage difference at the input of amplifier 103. Signal $E_8$, corresponding to the amplified voltage difference, adds to the voltage from network 21 to correct signal $E_7$ for an increase in temperature above ambient temperature.

Referring to FIG. 4, as the ambient temperature decreases below the reference temperature level, the resistance value of thermistor 118 increases causing signal $E_9$ to increase accordingly. Signal $E_9$ is 180° out of phase with the voltage from the resistor divider network, due to voltage $E_{14}$ being 180° out of phase with voltage $E_1$, thereby reducing the voltage applied to amplifier 31 to correct voltage $E_7$.

The present invention provides a digital indicating system including a counter whose counting rate decreases as the error signal approaches a null. The null is accurately defined by reference voltages and the count is positively stopped when the error signal is at the null. Independent high and low temperature compensation also is provided which require only two initial adjustments.

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. A system for providing a digital output corresponding to a condition, comprising:

counting means providing the digital output;

signal means providing an error signal corresponding to the difference between the digital output and the condition;

means for controlling the counting rate connected to the signal means and to the counting means and providing a pulse train of one frequency when the error signal is above a predetermined amplitude and a pulse train of another lesser frequency when the error signal is below the predetermined amplitude;

means connected to the counting means and to the signal means for nulling the error signal so that the digital output from the counting means corresponds to the condition when the error signal is at null;

means connected to the signal means for sampling the error signal;

means connected to the sampling means for holding the sampled error signal;

means for comparing the held error signal to reference signals defining null limits for the error signal; and switching means connected to the controlling means, the comparing means and the counting means and controlled by the comparing means for passing one of the pulse trains from the controlling means to the counting means when the error signal is outside the null limits and for blocking the pulse train when the error signal is within the null limits.

2. A system of the kind described in claim 1 in which the sampling means includes a zero crossover detector providing a pulse when an alternating current reference voltage, phase related to the error signal, crosses the zero amplitude level, a monostable multivibrator connected to the detector and providing a sampling pulse in response to alternate pulses from the detector, and a sampling circuit, connected to the signal means, to the multivibrator and to the holding means, samples the error signal in response to the sampling pulses from the multivibrator.

3. A system for providing a digital output corresponding to a condition, comprising:

counting means providing the digital output;

signal means providing an alternating current error signal corresponding to the difference between the digital output and the condition;

means for controlling the counting rate connected to the signal means and to the counting means and providing a pulse train of one frequency when the error signal is above a predetermined amplitude and a pulse train of another frequency when the error signal is below the predetermined amplitude;

means connected to the counting means and to the signal means for nulling the error signal so that the digital output from the counting means corresponds to the condition when the error signal is at null;

first temperature compensating means connected to the nulling means for applying a compensating signal to the nulling means in response to an increase in ambient temperature from a reference temperature level; and second temperature compensating means including a voltage divider network having a plurality of grounded resistors and receiving an alternating signal phase related to the alternating error signal, and connected to the nulling means for independently applying another compensating signal to the nulling means in response to a decrease in temperature from the temperature level, and a thermistor connected across the grounded resistors for changing said compensating signal as the temperature decreases below the reference temperature level.

4. A system of the kind described in claim 3 wherein:

the first temperature compensating means includes means for providing a control signal when the ambient temperature increases above the reference temperature level, and means connected to the control signal means and controlled by the control signal to provide the first mentioned temperature compensating signal when the temperature increases above the reference temperature level; and the control signal means including a voltage divider receiving an alternating current voltage, phase related to the error signal, and providing a variable output which may be changed to calibrate the first temperature compensating means, an amplifier, a feedback resistor connected between an input and an output of the amplifier, and a thermistor connecting the voltage divider to the input of the amplifier and cooperating with the feedback resistor to change the gain of the amplifier so that the control signal provided by the amplifier increases in amplitude as the ambient temperature increases above the reference temperature level.

5. A system of the kind described in claim 4 in which the compensating signal means includes a network providing two equal outputs when the ambient temperature is at the reference temperature level and providing unequal outputs when the ambient temperature is above the reference temperature level, where the difference between the outputs corresponds to the increase in the ambient temperature, in response to the control signal from the amplifier; and means connected to the network for providing the first mentioned compensating signal in accordance with the difference between the outputs from the network.

6. A system of the kind described in claim 5 in which the network includes a resistor connecting the amplifier to one input of the difference means, and a thermistor connecting the amplifier to another input of the difference means, the thermistor having a resistance value equal to that of the resistor at the reference temperature level which decreases as the temperature increases to cause the inputs to the difference means to differ.